United States Patent
Ohgami (10) Patent No.: US 7,768,855 B2
(45) Date of Patent: Aug. 3, 2010

(54) SEMICONDUCTOR MEMORY DEVICE AND SENSE AMPLIFIER

(75) Inventor: Takeshi Ohgami, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/506,631

(22) Filed: Jul. 21, 2009

(65) Prior Publication Data

US 2009/0279372 A1    Nov. 12, 2009

Related U.S. Application Data

(62) Division of application No. 11/972,085, filed on Jan. 10, 2008, now Pat. No. 7,583,550.

(30) Foreign Application Priority Data

Jan. 10, 2007    (JP) ............................. 2007-002273

(51) Int. Cl.
*G11C 7/00* (2006.01)
(52) U.S. Cl. ...................... 365/203; 365/207
(58) Field of Classification Search ................ 365/203, 365/207, 205; 257/296
See application file for complete search history.

(56) References Cited

U.S. PATENT DOCUMENTS

| | | | |
|---|---|---|---|
| 4,825,417 A | 4/1989 | Seo | |
| 5,389,810 A | 2/1995 | Agata et al. | |
| 5,875,138 A * | 2/1999 | Hoenigschmid | 365/203 |
| 6,560,141 B2 * | 5/2003 | Osada et al. | 365/154 |
| 6,791,132 B2 | 9/2004 | Nakai et al. | |
| 6,809,336 B2 | 10/2004 | Kunikiyo et al. | |
| 7,684,270 B2 * | 3/2010 | Hirota et al. | 365/202 |
| 2003/0173593 A1 | 9/2003 | Miyatake et al. | |
| 2004/0026759 A1 | 2/2004 | Nakabayashi | |
| 2005/0270819 A1 | 12/2005 | Sekine | |

FOREIGN PATENT DOCUMENTS

| | | |
|---|---|---|
| JP | 2002-022108 | 1/2000 |
| JP | 2003-045186 | 2/2003 |
| JP | 2006-135322 | 5/2006 |

OTHER PUBLICATIONS

Japanese Patent Office issued a Japanese Office Action dated Mar. 16, 2009, Application No. 2007-002273.

* cited by examiner

*Primary Examiner*—Anh Phung
(74) *Attorney, Agent, or Firm*—Young & Thompson (57) ABSTRACT

In a sense amplifier circuit having a plurality of sense amplifier portions arranged in order, each of the sense amplifier portions includes a transistor that supplies a bit line potential to a bit line pair in a corresponding column of a memory cell array and a gate electrode for supplying a precharge signal to a gate of the transistor. The gate electrode of the plurality of sense amplifier portions is provided as one piece as a whole and extends in a direction parallel to a row direction in the memory cell array. A gate electrode portion which is a connected portion between the gate electrode in a k-th sense amplifier portion and the gate electrode in a (k+1)-th sense amplifier portion is ring-shaped, where k is an odd number.

8 Claims, 7 Drawing Sheets

FIG. 1

PRIOR ART

FIG. 2

PRIOR ART

FIG. 3

PRIOR ART

SEMICONDUCTOR MEMORY DEVICE AND SENSE AMPLIFIER

BACKGROUND OF THE INVENTION

1. Field of the Invention

The present invention relates to a semiconductor memory device and, more particularly, to a sense amplifier circuit provided within a semiconductor memory device.

2. Description of the Related Arts

In recent years, semiconductor memory devices exemplified by DRAMs (dynamic random access memories) have been developed on the basis of the use of leading-edge semiconductor device manufacturing processes and the scaledown of semiconductor memory devices is being carried out. In semiconductor memory devices, the size of a memory cell region is changing in the direction of shrinkage due to the ongoing scaledown in fabrication processes of the semiconductor devices. However, the scaledown as viewed form the standpoint of the whole semiconductor memory device has not been going on compared to the scaledown in the memory cell region and, for this reason, the shrinkage of the size of circuits provided in what is called a peripheral region in a semiconductor memory device has posed a new problem. This problem is remarkable particularly in sense amplifiers. In pushing forward with the scaledown of semiconductor memory devices also in the future, it is necessary to make contrivance in order to reduce a relative increase in the size of a sense amplifier on a semiconductor chip.

Figure 1:
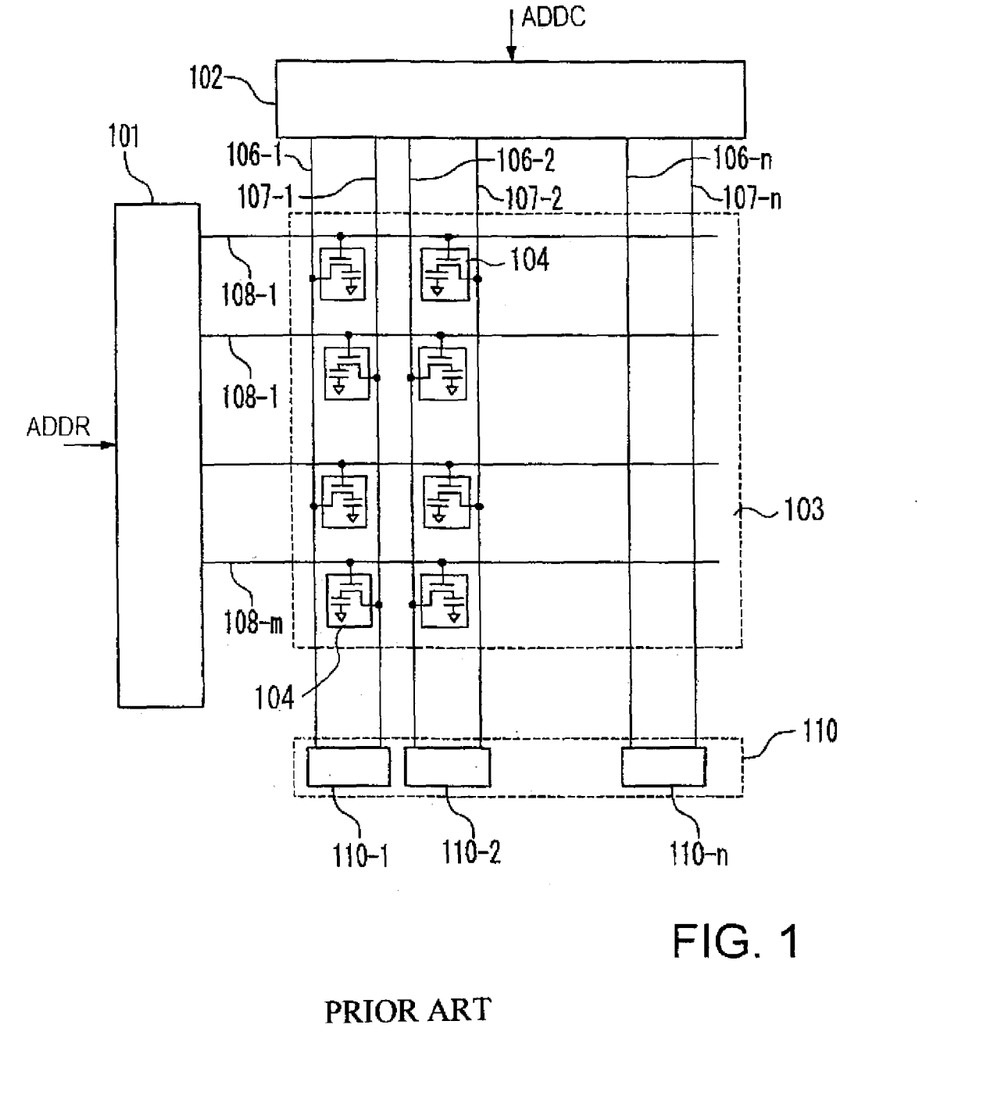
FIG. 1 is a block diagram showing the configuration of a semiconductor memory device configured as a DRAM in a related art.

In order to explain a sense amplifier provided within a semiconductor memory device, a description will be given of a semiconductor memory device of a related art provided with a sense amplifier. FIG. 1 shows the configuration of a semiconductor memory device of a related art configured as a DRAM.

This semiconductor memory device is provided with m word lines 108-1 to 108-*m*, n sets of bit line pairs, word driver 101 that drives the word lines, data driver 102 that drives bit lines, memory cell array 103, and sense amplifier circuit 110. Each of the n bit line pairs includes bit lines 106-1 to 106-*n* as first bit lines and bit lines 107-1 to 107-*n* as second bit lines. Sense amplifier circuit 110 is provided with n sense amplifier portions 110-1 to 110-*n*. The sense amplifier portion is provided for each bit line pair. Here, m and n are even numbers of not less than 2. With sense amplifier portion 110-1 serving as the first one and sense amplifier portion 111-*n* as the n-th one, n sense amplifier portions 110-1 to 110-*n* are arranged in a line from left to right in the figure in this order. As will be described later, n sense amplifier portions 110-1 to 110-*n* share a gate electrode and a bit line potential supply line and, therefore, these sense amplifier portions are arranged a one group to form sense amplifier circuit 110.

Memory cell array 103 is such that memory cells are provided in matrix form, and contains (m×n) memory cells 104 that are arranged in m rows and n columns.

This semiconductor memory is connected to an unillustrated CPU (central processing unit) and stores data required by the CPU. And in the semiconductor memory device, during a memory access operation, word driver 101 decodes address signal ADDR as a row address from the CPU and drives word line 108-*i* (i=1, 2, . . . , m) selected from word lines 108-1 to 108-*m* according to address signal ADDR. When the word lines are driven by word driver 101, n sense amplifier portions 110-1 to 110-*n* supply a bit line reference potential to n bit line pairs (bit lines 106-1 to 106-*n* and bit lines 107-1 to 107-*n*) and amplify the potential of the bit lines up to the bit line reference potential. The memory access operation includes the data writing operation to the memory cells and the data reading operation from the memory cells.

During a memory access operation, data driver 102 receives address signal ADDC as a column address from the CPU. Data driver 102 decodes the address signal ADDC, and drives the j-th (j=1, 2, . . . , n) column selection line corresponding to address signal ADDC among n column selection lines. By the driving of the j-th column selection line, there are selected sense amplifier portion 110-*j* that is selected from n sense amplifier portions 110-1 to 110-*n* and the bit line pair (bit line 106-*j*, bit line 107-*j*) that is selected from n bit line pairs (bit lines 106-1 to 106-*n*, bit lines 107-1 to 107-*n*). Selected sense amplifier portion 110-*j* performs memory access to memory cell 104 connected to selected word line 108-*i* and a selected bit line pair (bit line 106-*j* or bit line 107-*j*).

Figure 2:
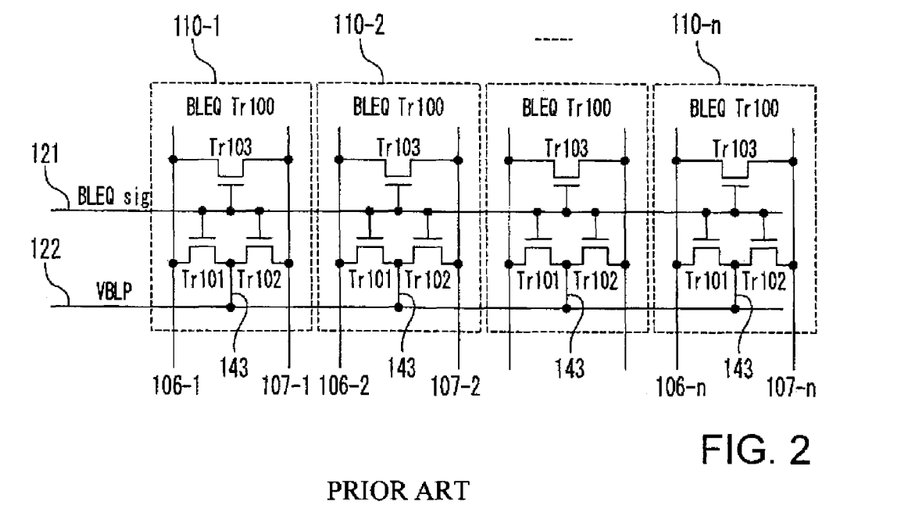
FIG. 2 is a circuit diagram showing the configuration of a sense amplifier in the semiconductor memory device shown in FIG. 1.

FIG. 2 shows the configuration of sense amplifier circuit 110 including n sense amplifier portions 110-1 to 110-*n*. All of sense amplifier portions 110-1 to 110-*n* are of the same electrical configuration, and are provided with transistor BLEQ Tr100, gate electrode 121, and bit line potential supply line 122. Transistor BLEQ Tr100 includes transistors Tr101, Tr102 and Tr103. Gate electrode 121 is formed to be common to n sense amplifier portions 110-1 to 110-*n*, that is, gate electrode 121 of n sense amplifier portions 110-1 to 110-*n* is formed as one piece. Similarly, bit line potential supply line 122 is also provided to be common to n sense amplifier portions 110-1 to 110-*n*.

Transistors Tr101 of sense amplifier portions 110-1 to 110-*n* connect bit lines 106-1 to 106-*n*, respectively, to line potential supply line 122. Transistors Tr102 of sense amplifier portions 110-1 to 110-*n* connect bit lines 107-1 to 107-*n*, respectively, to bit line potential supply line 122. Transistors Tr103 of sense amplifier portions 110-1 to 110-*n* are inserted between bit lines 106-1 to 106-*n* and bit lines 107-1 to 107-*n*, respectively. The gates of transistors Tr101, Tr102, Tr103 of sense amplifier portions 110-1 to 110-*n* are commonly connected to gate electrode 121. Gate electrode 121 and bit line potential supply line 122 extend in a row direction with respect to memory cell array 103, and sense amplifier portions 110-1 to 110-*n* are connected in a row direction with respect to memory cell array 103 from the first one to the last one from left to right in the figure in this order. Bit line potential VBLP is supplied to bit line potential supply line 122 as the above-described bit line reference potential.

Figure 3:
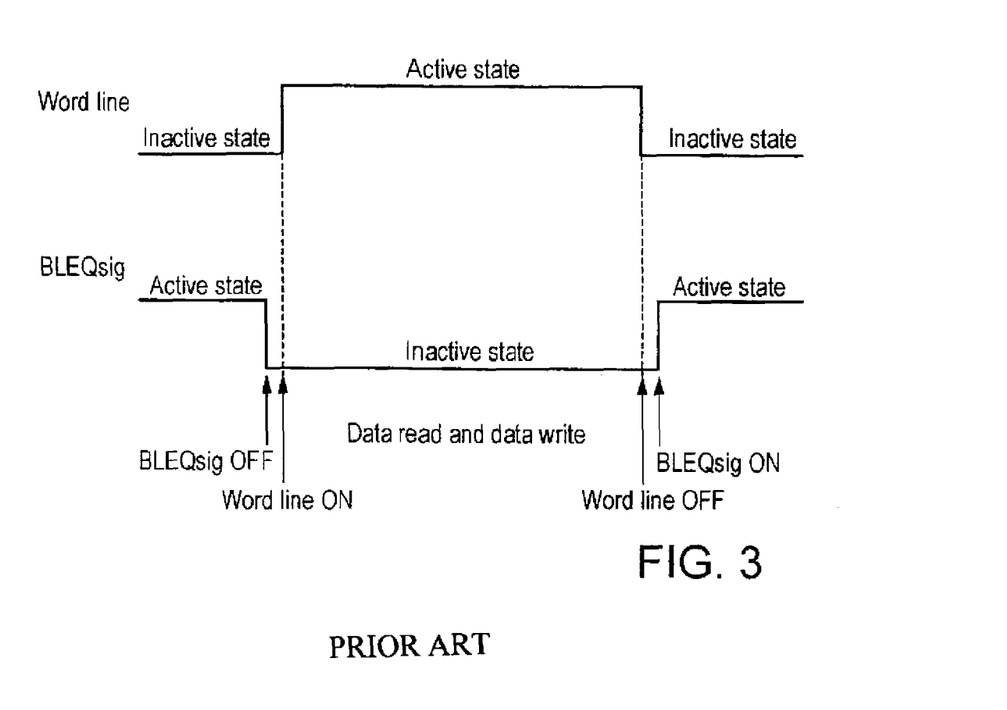
FIG. 3 is a timing chart showing a relationship between a signal supplied to a word line and precharge signal BLEQsig.

The timing chart of FIG. 3 shows the relationship between a signal supplied to a word line and precharge signal BLEQsig. When a word line, i.e., selected word line 108-*i* is not driven by word driver 101, precharge signal BLEQsig is supplied to gate electrode 121. That is, the signal level of precharge signal BLEQsig is in an active state. At this time, transistors Tr101 of sense amplifier portions 110-1 to 110-*n* are each in an ON-state and supply bit line potential VBLP to bit lines 106-1 to 106-*n*, transistors Tr102 are each in an ON-state and supply bit line potential VBLP to bit lines 107-1 to 107-*n*, and transistors Tr103 are each in an ON-state and equalize the potentials of bit lines 106-1 to 106-*n* and of bit lines 1076-1 to 107-*n*.

When a word line is driven by word driver 101 during a memory access operation, precharge signal BLEQsig is not supplied to gate electrode 121. That is, as shown in FIG. 3, the signal level of precharge signal BLEQsig changes from an active state to an inactive state, and immediately thereafter the word line is brought into an active state.

When the memory access operation is finished, the word line comes to a nondriven state and precharge signal BLEQsig is supplied to gate electrode 121. That is, as shown in FIG. 3, the signal level of precharge signal BLEQsig changes from an inactive state to an active state.

Figure 4:
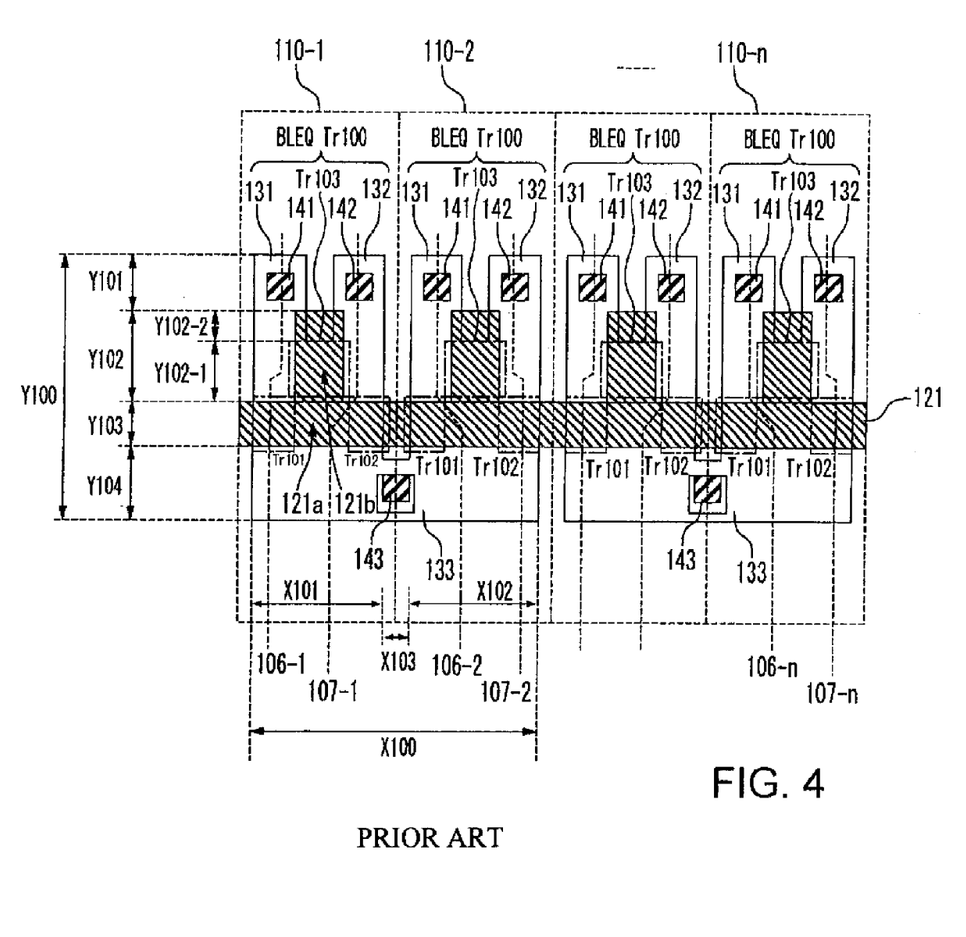
FIG. 4 is a plan view showing the arrangement of a plurality of sense amplifier portions in a sense amplifier circuit in the semiconductor memory device shown in FIG. 1.

FIG. 4 shows the plan configuration of sense amplifier circuit 110 having n sense amplifier portions 110-1 to 110-n. In FIG. 4, however, the descriptions of an interlayer insulating film and an upper-level interconnect layer are omitted. In the figure, the portions hatched with thin oblique solid lines indicate gate electrodes 121, and the portions hatched with thick oblique solid lines indicate contacts 141 to 143 used for the connection with bit lines.

Gate electrode 121 is provided in the shape of the letter T for each of sense amplifier portions 110-1 to 110-n. For each of sense amplifier portions 110-1 to 110-n, gate electrode 121 contains row-direction gate electrode portion 121a that extends in the row direction, i.e., in the horizontal direction of the figure and column-direction gate electrode portion 121b that is connected perpendicularly to row-direction gate electrode portion 121a.

Each of sense amplifier portions 110-1 to 110-n is further provided with first bit line-connected active region 131, second bit line-connected active region 132, contact region 133, first bit line contact 141, second bit line contact 142, and bit line potential supply contact 143. For each of sense amplifier portions 110-1 to 110-n, first bit line contact 141 is formed on first bit line-connected active region 131 and connected to a relevant one among bit lines 106-1 to 106-n, second bit line contact 142 is formed on second bit line-connected active region 132 and connected to a corresponding one among bit lines 107-1 to 107-n, and bit line potential supply contact 143 is provided in contact region 133 and connected to bit line potential supply line 122.

For each of sense amplifier portions 110-1 to 110-n, transistor Tr101 is provided between first bit line-connected active region 131 and contact region 133, and the gate of transistor Tr101 is connected to row-direction gate electrode portion 121a. Similarly, transistor Tr102 is provided between second bit line-connected active region 132 and contact region 133, and the gate of transistor Tr102 is connected to row-direction gate electrode portion 121a. Also, transistor TR103 is provided between first bit line-connected active region 131 and second bit line-connected active region 132 and the gate of transistor TR103 is connected to column-direction gate electrode portion 121b. Concretely, transistors Tr101, Tr102 are arranged in such a manner that the channel regions thereof are positioned on the underside of row-direction gate electrode portion 121a via a gate insulating film. Transistor Tr103 is arranged in such a manner that the channel region thereof is positioned on the underside of column-direction gate electrode portion 121b via a gate insulating film.

Sense amplifier circuit 110 contains n/2 pieces of contact regions 133, and each of contact regions 133 is shared by odd-number-th sense amplifier portions 110-1, 110-3, . . . , 110-(n−1) and even-number-th sense amplifier portions 110-2, 110-4, . . . , 110-n adjacent to the odd-number-th sense amplifier portions on the right side thereof in the figure. That is, h-th contact regions (h=1, 2, . . . , n/2) are shared by (2h−1)-th sense amplifier portion and 2h-th sense amplifier portion.

Now consideration is given to the size of an odd-number-th sense amplifier portion and an even-number-th sense amplifier portion that shares contact region 13 along with this odd-number-th sense amplifier portion. Because all of the odd-number-th sense amplifiers have the same shape and all of the even-number sense amplifier portions have the same shape, sense amplifier portions 110-1, 110-2 will be considered here.

The length of sense amplifier portions 110-1, 110-2 in the row direction, i.e., the horizontal direction in the figure is denoted by X100. Length X100 is a sum of row-direction length X101 of sense amplifier portion 110-1, row-direction length X102 of sense amplifier portion 110-2, and row-direction length X103 of bit line potential supply contact 143. Here, it is assumed that length X101 and length X102 are equal.

Sense amplifier portion 110-1 and sense amplifier portion 110-2 have the same column-direction length and this length is denoted by Y100. As shown in FIG. 4, length Y100 is a sum of length Y101, length Y102, length Y103 and length Y104. In first bit line-connected active region 131 and second bit line-connected active region 132, length Y101 indicates a column-direction length of a region in which first bit line contact 141 and second bit line contact 142 are each arranged. Length Y102 indicates a column-direction length of a region in which first bit line-connected active region 131 and second bit line-connected active region 132 overlap column-direction gate electrode portion 121b. Length Y102 is a sum of column-direction length Y102-1 of a part of column-direction gate electrode portion 121b to which the gate of transistor Tr103 is connected and column-direction of length Y102-2 of a part which is other than the portion corresponding to length Y102-1. Length Y103 indicates the width of row-direction gate electrode portion 121a. Length Y104 indicates the column-direction length of contact region 133.

In the semiconductor memory device of a related art shown in FIGS. 1, 2 and 4, for example, there occurs the problem that it is impossible to reduce the column-direction size of sense amplifier circuit 110 for the following reason.

First, transistor Tr103 is arranged in column-direction gate electrode portion 121b. For this reason, above-described lengths Y102-1, Y102-2 become necessary. Thus, transistor Tr103 is arranged in column-direction gate electrode portion 121b, and hence above-described length Y101 becomes necessary because first bit line contact 141 and second bit line contact 142 are respectively arranged in first bit line-connected active region 131 and second bit line-connected active region 132 by just that much. Furthermore, above-described length Y104 becomes necessary because bit line potential supply contact 143 is arranged in contact region 133.

Therefore, in order to reduce the size of a sense amplifier circuit, it is necessary to reduce the size of transistor Tr103.

Examples of known techniques for reducing the area of memory cells and sense amplifiers on a chip in a semiconductor memory device and techniques for improving the characteristics of sense amplifiers are as follows.

JP-A-2000-022108 discloses a semiconductor memory device that permits a reduction of the total parasitic capacitance of input and output lines and a reduction of the area of sense amplifier drivers on a semiconductor chip. This semiconductor memory device is provided with a memory cell array region, a sense amplifier region and a subword driver region and a cross region of the sense amplifier region and the subword driver region. The sense amplifier region and the subword driver regions are arranged adjacent the memory cell region. A switch MOS transistor between an main input/output line and a local input/output line is arranged in the above-described cross region, a folded gate MOS transistor is used in this switch MOS transistor, an inner diffusion layer to a folded gate is connected to the main/output line whereas an outer diffusion layer is connected to the local input/output line, whereby it is possible to reduce the total parasitic capacitance of the input/output lines and it is possible to reduce the area of sense amplifiers.

US 2003/0173593A1 discloses a semiconductor memory device capable of high-speed reading and of reducing the area of memory cells. This semiconductor memory device is provided with a plurality of folded bit line pairs arranged parallel to each other, a plurality of word lines orthogonal to the plurality of bit line pairs, and dynamic memory cells that are arranged in matrix shape in positions corresponding to points of intersection of the multiple bit line pairs and the multiple word lines. Each dynamic memory cell is provided with one transistor and one capacitor. In this semiconductor memory device, one electrode of a capacitor of each memory cell, together with one electrode of each of other multiple capacitors arranged in matrix shape, is connected to a common electrode, the other electrode of the capacitor is connected to a source electrode of a transistor, a drain electrode of the transistor is connected to a bit line pair, and a gate electrode of the transistor is connected to a word line. If half of the pitch of word lines is denoted by F, the pitch of the bit lines of a bit line pair is larger than 2F and smaller than 4F.

US 2005/0270819A1 discloses a semiconductor memory device that has a sense amplifier constituted by a pair transistor and enables the sense amplifier area to be reduced without a deterioration in the characteristics of the pair transistor. In this semiconductor memory device, a pair transistor having a prescribed function is arrayed by being repeated a plurality of times. Transistors adjacent to each other in the row direction are regarded as a pair transistor and this pair transistor is provided in quantities of multiple sets. Transistors whose arrangement relation is an oblique direction are regarded as a pair transistor and this pair transistor is further provided in quantities of multiple sets. These pair transistors are arrayed in multiple pairs, whereby the pair transistor groups are formed so that the sense amplifier area can be reduced.

US 2004/0026759 discloses a semiconductor device in which a DRAM region and a high-speed CMOC logic region are arranged in a mixed manner, and the sensitivity of sense amplifiers is increased in this semiconductor device. In this semiconductor device, a gate electrode pair of an N-type sense amplifier transistor and a gate electrode pair of a P-type sense amplifier transistor that constitute a CMOS sense amplifier of a DRAM are each arranged parallel within one active region in the same direction as bit lines, and an adjacent N-type sense amplifier transistor pair and an adjacent P-type sense amplifier transistor pair are isolated and separated by an element isolating region.

U.S. Pat. No. 5,389,810 discloses a semiconductor device whose layout size can be shrunk when it is applied to a sense amplifier. This semiconductor device is provided with a semiconductor layer having a top surface, an active region formed on the top surface of the semiconductor layer, an isolation region that is formed on the top surface of the semiconductor layer and encloses the active region, and a pair of MOSFETs formed in the active region. The pair of MOSFETs has a structure that is symmetrical with respect to a first symmetric plane substantially perpendicular to the top surface of the semiconductor layer and also symmetrical with respect to a second symmetric plane perpendicular to both the top surface of the semiconductor layer and the first symmetric plane. Each of the MOSFETs has a source region, a drain region and a channel region that are formed on a surface of the active region. The source region is formed to be common to the pair of MOSFETs, and each of the drain regions is separated from the source region by each of the channel regions.

As described above, some techniques capable of reducing the size of a sense amplifier circuit on a chip have been proposed. However, these techniques have the problems that the interconnect layout on a chip becomes complicated and that there is room for a further shrinkage of area.

SUMMARY OF THE INVENTION

An object of the present invention is to provide a sense amplifier circuit that is used in a semiconductor memory device and whose size can be reduced.

Another object of the present invention is to provide a semiconductor memory device in which the size of a sense amplifier circuit is reduced.

According to a first aspect of the present invention, there is provided a sense amplifier circuit having a plurality of sense amplifier portions arranged in order, in which each of the plurality of sense amplifier portions comprises: a bit line potential supply line to which a bit line potential is supplied; a transistor that is connected to the bit line potential supply line and is turned on when the signal level of a precharge signal is in an active state, thereby to supply the bit line potential to a bit line pair in a corresponding column of a memory cell array; and a gate electrode for supplying the precharge signal to a gate of the transistor. In this sense amplifier circuit, the gate electrode of the plurality of sense amplifier portions is provided as one piece as a whole and extends in a direction parallel to a row direction in the memory cell array, and a gate-electrode portion is ring-shaped. The gate electrode portion being a connected portion between the gate electrode in a k-th sense amplifier portion among the plurality of sense amplifier portions and the gate electrode in a (k+1)-th sense amplifier portion, where k is an odd number.

According to a second aspect of the present invention, there is provided a semiconductor memory device that comprises: a memory cell array in which memory cells are provided in matrix form; a plurality of word lines respectively connected to a plurality of rows of the memory cell array; a plurality of bit line pairs respectively connected to the plurality of columns of the memory cell array; a word driver that drives a word line selected from the plurality of word lines according to a row address during a memory access operation; and a plurality of sense amplifier portions that are arranged in order and supply a bit line potential to the plurality of bit line pairs during a memory access operation. In this semiconductor memory device, each of the plurality of sense amplifier portions comprises: a bit line potential supply line to which the bit line potential is supplied; a transistor that is connected to the bit line potential supply line and is turned on when the signal level of a precharge signal is in an active state, thereby to supply the bit line potential to the bit line pair in a corresponding column of the memory cell array; and a gate electrode for supplying the precharge signal to a gate of the transistor. In this semiconductor memory device, the gate electrode of the plurality of sense amplifier portions is provided as one piece as a whole and extends in a direction parallel to a row direction in the memory cell array, and a gate-electrode portion is ring-shaped. The gate electrode portion being a connected portion between the gate electrode in a k-th sense amplifier portion among the plurality of sense amplifier portions and the gate electrode in a (k+1)-th sense amplifier portion, k being an odd number.

According to the present invention, it is possible to reduce the size of the gate electrode and it is possible to make rational the arrangement of each element within the sense amplifier portion, with the result that it is possible to reduce the size of the sense amplifier on a semiconductor chip.

The above and other objects, features, and advantages of the present invention will become apparent from the following description based on the accompanying drawings which illustrate examples of preferred embodiments of the present invention.

DETAILED DESCRIPTION OF THE EXEMPLARY EMBODIMENTS OF THE INVENTION

A semiconductor memory device in an exemplary embodiment of the present invention is provided with at least a memory cell and a sense amplifier for reading date from the memory cell, and is a semiconductor memory device, such as a DRAM, an SRAM (static random access memory), a flash memory and the like. A semiconductor memory device of this exemplary embodiment is installed in a computer provided with a CPU and a clock generation circuit. Although the following description will be given on the assumption that the semiconductor memory device is a DRAM, it is needless to say that the present invention can be applied also to a semiconductor memory device other than a DRAM.

Figure 5:
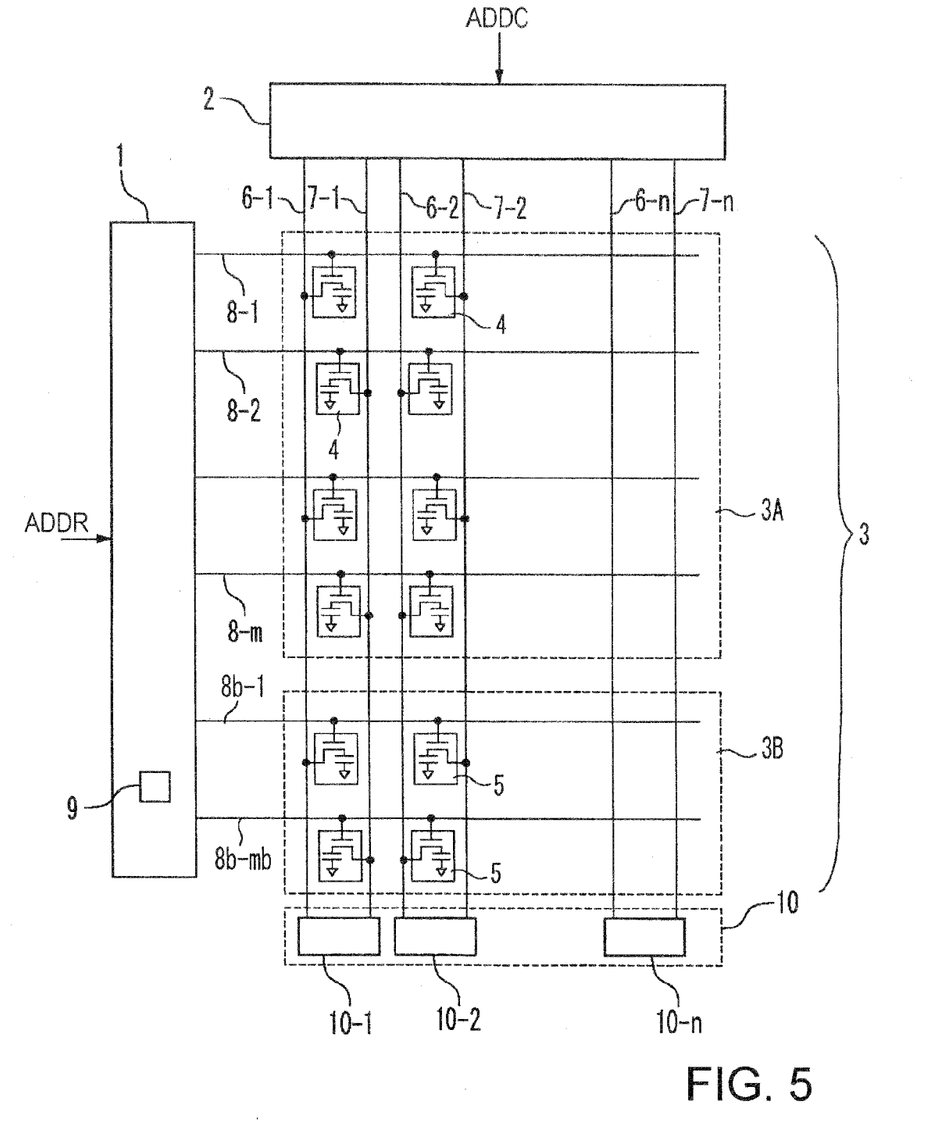
FIG. 5 is a block diagram showing the configuration of a semiconductor memory device in an exemplary embodiment of the present invention configured as a DRAM.

FIG. 5 shows the configuration of a semiconductor memory device of this embodiment. This semiconductor memory device is provided with m word lines 8-1 to 8-$m$, mb redundancy word lines 8$b$-1 to 8$b$-$mb$, n sets of bit line pairs, word driver 1 that drives the word lines and the redundancy word lines, data driver 2 that drives the bit lines, memory cell array 3, and sense amplifier circuit 110. The n bit line pairs respectively includes bit lines 6-1 to 6-$n$ as first bit lines and bit lines 7-1 to 7-$n$ as second bit lines. Sense amplifier circuit 10 is provided with n sense amplifier portions 10-1 to 10-$n$. The sense amplifier portion is provided for each bit line pair. Here, m, mb and n are all even numbers of not less than 2.

Memory cell array 3 is a region in which a plurality of memory cells are arranged in matrix form, and this region is broadly divided into ordinary memory cell region 3A and redundancy memory cell region 3B. In ordinary memory cell region 3A, there are provided (m×n) memory cells 4 that are arranged in m rows and n columns. On the other hand, in the redundancy memory cell region, there are provided (mb×n) redundancy memory cells 5 that are arranged in mb rows and n columns.

Each of memory cells 4 contains a transistor and a capacitor to which a source of the transistor is connected. Memory cells 4 are arranged as a matrix in m rows and n columns. For each row, a corresponding one among m word lines 8-1 to 8-$m$ is connected to the gates of transistors of memory cells 4 belonging to the row. Similarly, for each column, a corresponding pair among n bit line pairs is connected to the drains of transistors of memory cells 4 belonging to the column. Concretely, odd-number-th bit lines 6-1, 6-3, . . . , 6-($n$-1) among the first bit lines are connected to the drains of transistors of memory cells 4 in odd-number-th rows and odd-number-th columns. Odd-number-th bit lines 7-1, 7-3, . . . , 7-($n$-1) among the second bit lines are connected to the drains of transistors of memory cells 4 in even-number-th rows and odd-number-th columns. Even-number-th bit lines 7-2, 7-4, . . . , 7-$n$ among the second bit lines are connected to the drains of transistors of memory cells 4 in odd-number-th rows and even-number-th columns. Even-number-th bit lines 6-2, 6-4, . . . , 6-$n$ among the first bit lines are connected to the drains of transistors of memory cells 4 in even number-th rows and even-number-th columns.

Similarly, each of redundancy memory cells 5 contains a transistor and a capacitor to which a source of the transistor is connected. As described above, redundancy memory cells 5 are arranged as a matrix in mb rows and n columns. For each row, a corresponding one among mb redundancy word lines 8$b$-1 to 8$b$-$mb$ is connected to the gates of transistors of redundancy memory cells 5 belonging to the row. For each column, a corresponding pair among n bit line pairs is connected to the drains of transistors of redundancy memory cells 5 belonging to the column. Concretely, in the same manner as with the above-described case, the drains of redundancy bit cells 5 in odd-number-th columns and odd-number-th rows are connected to first bit lines 6-1, 6-3, . . . of odd-number-th bit line pairs. The drains of redundancy bit cells 5 in odd-number-th columns and even-number-th rows are connected to second bit lines 7-1, 7-3, . . . of odd-number-th bit line pairs. The drains of redundancy bit cells 5 in even-number-th columns and odd-number-th rows are connected to first bit lines 6-2, 6-4, . . . of even-number-th bit line pairs. The drains of redundancy bit cells 5 in odd-number-th rows are connected to second bit lines 7-2, 7-4, . . . of even-number-th and even-number-th bit line pairs.

Word driver 1 operates in synchronization with an internal clock signal (not shown). Word lines 8-1 to 8-$m$ and redundancy word lines 8$b$-1 to 8$b$-$mb$ are connected to word driver 1. Word driver 1 has address replacement registration unit 9 in preparation for a case where it has been detected that a word line fails or a memory cell connected to a word line fails, a redundancy word line can be used in place of the failed word line. The address replacement registration unit 9 has the function of allocating a row address corresponding to a word line whose failure has been detected to a row address corresponding to a redundancy word line used as a substitute, and stores an original row address and a substituted address as information. The original row address corresponds to a word line connected to memory cells 4 in which there is a possibility of occurrence of a multibit error. The substituted row address corresponds to a redundancy word line connected to redundancy memory cells 5.

Data driver 2 operates in synchronization with the internal clock signal (not shown). To data driver 2, n bit line pairs (bit lines 6-1 to 6-$n$, bit lines 7-1 to 7-$n$) an n column selection lines (not shown) are connected. Because both memory cells 4 and redundancy memory cells 5 are arranged in n columns, to memory cells 4 and redundancy memory cells 5 belonging to the same column are commonly connected column selection lines of this column. These n column selection lines correspond to column addresses.

Sense amplifier circuit 10 is provided with a total of n sense amplifier portions 10-1 to 10-n provided for each bit line pair. Respectively, n bit line pairs (bit lines 6-1 to 6-n, bit lines 7-1 to 7-n) and n column selection lines are connected to these n sense amplifier portions 10-1 to 10-n.

Now the address changing operation by address replacement registration unit 9 will be described.

It is assumed here that first word line 8-1 has failed. Word driver 1 registers a row address corresponding to first word line 8-1 in address replacement registration unit 9 in accordance with an address change instruction. By referring to address replacement registration unit 9, word driver 1 determines one redundancy word line (a first redundancy word line) that can be used and is to correspond to word lone 8-1 among redundancy word lines 8b-1 to 8b-mb. Word driver 1 registers, in address replacement registration unit 9, a row address corresponding the determined first redundancy word line as a substituted row address by relating this row address to the row address of the first word line registered in the address replacement registration unit 9. The changeover from the original row address to the substituted row address, i.e., the changeover from memory cell 4 connected to first word line 8-1 to redundancy memory cell 5 connected to the first redundancy word line, is performed, for example, during a refresh operation.

During a memory access operation, word driver 1 receives row address ADDR from the CPU as an input and makes a judgment as to whether or not the row address ADDR and the row address registered in address replacement registration unit 9 are identical. This judgment is referred to as an address replacement acceptability judgment. The memory access operation mentioned here includes a write operation, a read operation, a refresh operation and the like. When the row addresses are not identical in the address replacement acceptability judgment, word driver 1 decodes row address ADDR, selects word line 8-$i$ ($i$=1, 2, . . . , m) corresponding to row address ADDR among word lines 8-1 to 8-$m$, and drives this word line. On the other hand, when the row addresses are identical in the address replace acceptability judgment, word driver 1 decodes the substituted row address corresponding to the identical row addresses as address ADD, selects redundancy word line 8-$ib$ ($ib$=1, 2, . . . , mb) corresponding to row address ADD among redundancy word lines 8b-1 to 8b-mb, and drives this redundancy word line. When a word line is driven by word driver 1, n sense amplifier portions 10-1 to 10-n supply the bit line reference potential as an electric potential to n bit line pairs (bit lines 6-1 to 6-n, bit lines 7-1 to 7-n), and amplify the potential of the bit lines to the bit line reference potential.

During a memory access operation, a column address ADDC from the CPU is supplied to data driver 2. Data driver 2 decodes the column address ADDC, selects a j-th (j=1, 2, . . . , n) column selection line corresponding to column address ADDC, and drives this column selection line. Because the j-th column selection line is driven, it follows that j-th sense amplifier portion 10-$j$ among n sense amplifier portions 10-1 to 10-n and the j-th bit line pair (bit line 6-$j$, bit line 7-$j$) among n bit line pairs are selected. Selected sense amplifier portion 10-$j$ performs memory access to memory cell 4 connected to selected word line 8-$i$ and the selected bit line pair (bit line 6-$j$ or bit line 7-$j$). Alternatively, selected sense amplifier portion 10-$j$ performs memory access to redundancy memory cell 5 connected to selected redundancy word line 8b-$ib$ and the selected bit line pair (bit line 6-$j$ or bit line 7-$j$).

In a case where the j-th column selection line is driven by data driver 2 when a write operation is performed as a memory operation, selected sense amplifier portion 10-$j$ outputs data from an internal circuit of the computer (not shown) as write data to the selected bit line pair (bit line 6-$j$, bit line 7-$j$). When row addresses are not identical in the above-described address replacement acceptability judgment, write data is written in memory cell 4 connected to selected word line 8-$i$ and the selected bit line pair (bit line 6$j$ or bit line 7$j$). On the other hand, when row addresses are identical in the address replacement acceptability judgment, the replacement of column addresses is performed and write data is written in redundancy memory cell 5 connected to selected redundancy word line 8b-$ib$ and the selected bit line pair (bit line 6$j$ or bit line 7$j$).

In a case where the j-th column selection line is driven by data driver 2 when a read operation is performed as a memory access operation, and besides when the row addresses are not identical in the above-described address replacement acceptability judgment, data is read from memory cell 4 connected to selected word line 8-$i$ and the selected bit line pair (bit line 6-$j$ or bit line 7-$j$) and output as read data to an internal circuit of the computer (not shown) via sense amplifier portion 10-$j$. On the other hand, when row addresses are identical in the address replacement acceptability judgment, data is read from redundancy memory cell 5 connected to selected redundancy word line 8b-$ib$ and the selected bit line pair (bit line 6-$j$ or bit line 7-$j$). This data is supplied as read data to an internal circuit of the computer (not shown) via sense amplifier portion 10-$j$.

Figure 6:
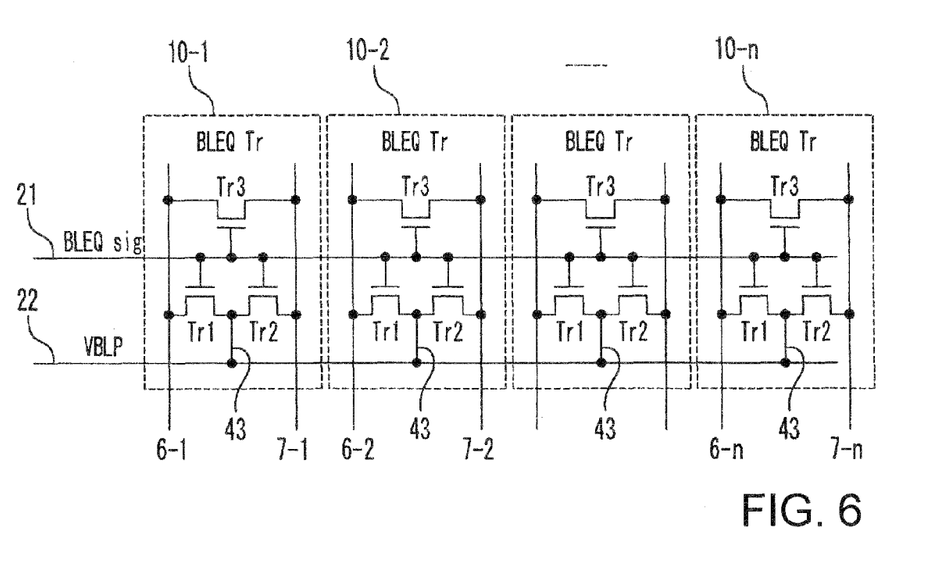
FIG. 6 is a circuit diagram showing the configuration of a sense amplifier circuit in the semiconductor memory device shown in FIG. 5.

Next, the configuration of sense amplifier circuit 10 in this exemplary embodiment will be described. FIG. 6 shows the configuration of the sense amplifier circuit having n sense amplifier portions 110-1 to 10-n. All of sense amplifier portions 10-1 to 10-n are of the same electrical configuration, and are provided with transistor BLEQ Tr, gate electrode 21, and bit line potential supply line 22 as with the sense amplifier circuit shown in FIG. 2. Transistor BLEQ Tr includes Tr1, Tr2 and Tr3. Gate electrode 21 is formed to be common to n sense amplifier portions 10-1 to 10-n, that is, gate electrode 21 of n sense amplifier portions 10-1 to 10-n is formed as one piece as a whole. Similarly, bit line potential supply line 22 is also provided to be common to n sense amplifier portions 10-1 to 10-n.

Transistors Tr1 to Tr3 in sense amplifier portions 10-1 to 10-n will be described. Transistors Tr1 respectively connect bit lines 6-1 to 6-n to bit line potential supply line 22. Transistors Tr2 respectively connect bit lines 7-1 to 7-n to bit line potential supply line 22. Transistors Tr3 are respectively inserted between bit lines 6-1 to 6-n and bit lines 7-1 to 7-n. In each of sense amplifier portions 10-1 to 10-n, the gates of transistors T1, Tr2, Tr3 are connected to gate electrode 21. Gate electrode 21 and bit line potential supply line 22 extend in a row direction with respect to memory cell array 3, and sense amplifier portions 10-1 to 10-n from the first one to the n-th one are connected in a row direction with respect to memory cell array 103 from left to right in the figure in this order. Bit line potential VBLP is supplied to bit line potential supply line 22 as the above-described bit line reference potential.

The relationship between a signal supplied to a word line or a redundancy word line and precharge signal BLEQsig is as shown in FIG. 3 above. When a word line, i.e., selected word line 8-$i$ or a redundancy world line 8b-$ib$ is not driven by word driver 1, precharge signal BLEQsig is supplied to gate electrode 21, and the signal level of precharge signal BLEQsig is in an active state. At this time, all transistors Tr1, Tr2 of each of sense amplifier portions are in an ON-state and supply bit line potential VBLP to bit lines 6-1 to 6-n and second bit lines 7-1 to 7-*n* of each bit line pair. Transistors Tr3 are each also in an ON-state and equalize the potentials of bit lines 6-1 to 6-*n* and the potentials of bit lines 7-1 to 7-*n* in each bit line pair.

When a word line is driven by word driver 1 during a memory access operation, precharge signal BLEQsig is not supplied to gate electrode 21. That is, as shown in FIG. 3, the signal level of precharge signal BLEQsig changes from an active state to an inactive state, and immediately thereafter the word line is brought into an active state.

When a memory access operation such as data write operation and data read operation is finished, the word line comes to a nondriven state and precharge signal BLEQsig is supplied to gate electrode 21 and the signal level of precharge signal BLEQsig changes from an inactive state to an active state.

Figure 7:
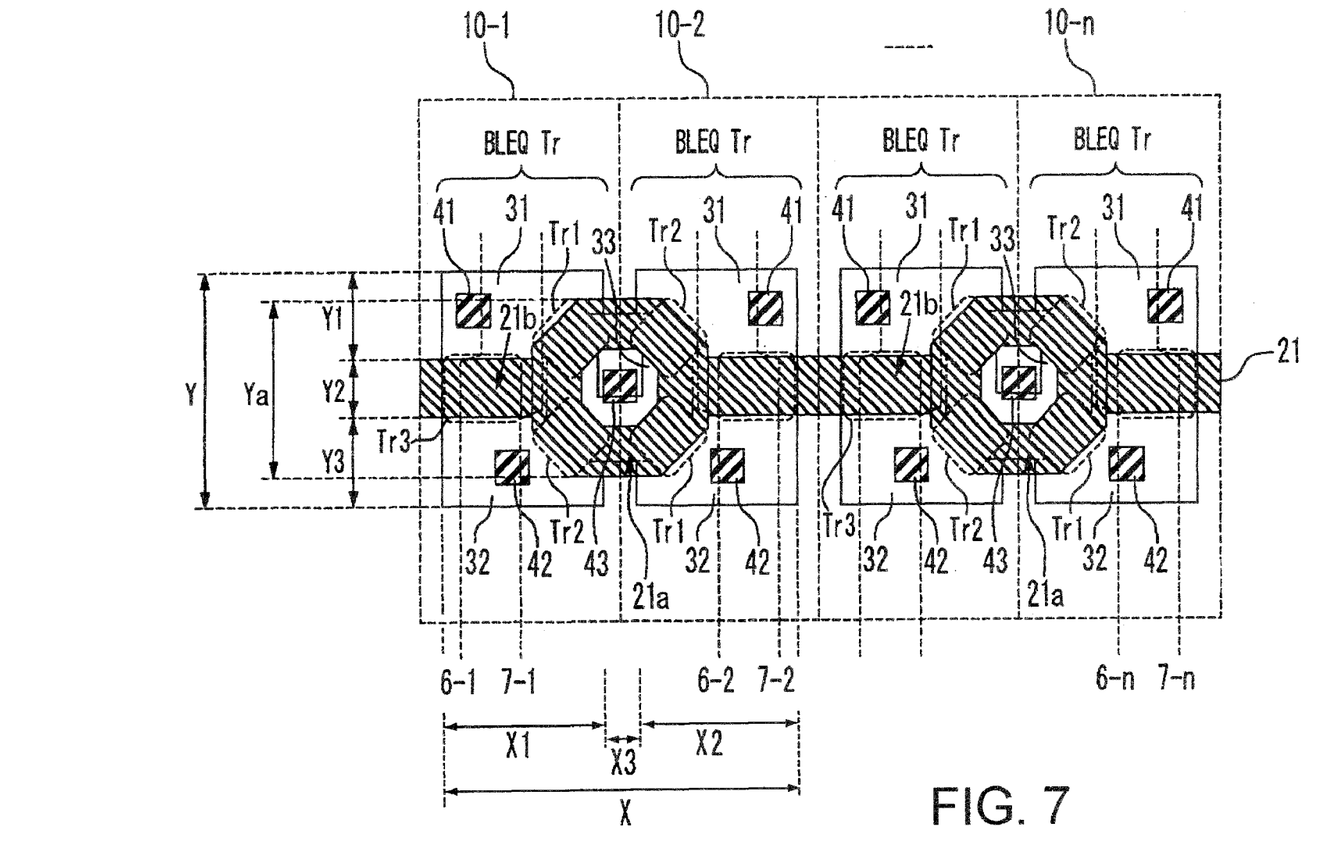
FIG. 7 is a plan view showing the arrangement of a plurality of sense amplifier portions in the sense amplifier circuit shown in FIG. 5.

Next, the geometrical configuration of the sense amplifier circuit in this exemplary embodiment will be described. FIG. 7 shows the plan configuration of sense amplifier circuit 10 having n sense amplifier portions 10-1 to 10-*n*. In FIG. 7, however, the descriptions of an interlayer insulating film and an upper-level interconnect layer are omitted. In the figure, the portions hatched with thin solid oblique lines indicate gate electrode 21, and the portions hatched with thick oblique solid lines indicate contacts 41 to 43 used for the connection with bit lines.

In this exemplary embodiment, gate electrode portion 21*a*, which is a connected portion between gate electrode 21 in odd-number-th sense amplifier portions 10-1, 10-3, . . . , 10-(*n*−1) among sense amplifier portions 10-1 to 10-*n* and gate electrode 21 in even-number-th sense amplifier portions 10-2, 10-4, . . . , 10-*n* adjacent to the odd-number-th sense amplifier portions on the right side thereof, is formed in a ring-shape. Examples of shapes of "ring-shaped" gate electrode portion described here include an annulus ring, an oval ring and shapes formed along the sides of a polygon. Examples of a polygon include a triangle, a quadrangle, a hexagon and an octagon. In the figure, a gate electrode portion 21*a* having a shape formed along the sides of a polygon is provided.

In other words, in a region where a k-th sense amplifier portion 10-*k* and a (k+1)-th sense amplifier portion 10-(*k*+1) are in contact with each other, k being any positive odd number of less than n, gate electrode 21 is formed in ring shape so as to straddle these two sense amplifier portions 10-*k* and 10-(*k*+1).

For each of sense amplifier portions 10-1 and 10-*n*, gate electrode 21 comprises above-described ring-shaped electrode portion 21*a* and row-direction gate electrode 21*b* other than electrode portion 21*a*. Row-direction electrode portion 21 is a portion extending in a direction parallel to the row direction in memory cell array 3. Particularly, in the case of the semiconductor memory device of this exemplary embodiment, if k is an odd number of not less than 3, then it follows that a (k−1)-th sense amplifier portion 10-(*k*−1) is arranged adjacent to a k-th sense amplifier portion 10-*k* on the left side thereof in the figure so as to be in contact therewith. Between these sense amplifier portions 10-(*k*−1) and 10-*k*, the gate electrode is mutually connected by row-direction electrode portion 21*b*.

Each of sense amplifier portions 10-1 to 10-*n* is further provided with first bit line-connected active region 31, second bit line-connected active region 32, contact region 33, first bit line contact 41, second bit line contact 42, and bit line potential supply contact 43. In each of sense amplifier portions, first bit line contact 41 is formed on first bit line-connected active region 31 and connected to a corresponding one among first bit lines 6-1 to 6-*n*. Second bit line contact 42 is formed on second bit line-connected active region 32 and connected to a corresponding one among second bit lines 7-1 to 7-*n*. Bit line potential supply contact 43 is provided in contact region 33 and connected to bit line potential supply line 22.

In each of sense amplifier portions 10-1 to 10-*n*, transistor Tr1 is provided between first bit line-connected active region 31 and contact region 33, and the gate of transistor Tr1 is connected to ring-shaped gate electrode portion 21*a*. Transistor Tr2 is provided between second bit line-connected active region 32 and contact region 33, and the gate of transistor Tr2 is connected to ring-shaped gate electrode portion 21*a*. Transistor TR3 is provided between first bit line-connected active region 31 and second bit line-connected active region 32 and the gate of transistor TR3 is connected to row-direction gate electrode portion 21*b*. Concretely, transistors Tr1, Tr2 are arranged in such a manner that the channel regions thereof are positioned on the underside of ring-shaped gate electrode portion 21*a* via a gate insulating film. Transistor Tr3 is arranged in such a manner that the channel region thereof is positioned on the underside of column-direction gate electrode portion 21*b* via a gate insulating film.

In this exemplary embodiment, sense amplifier circuit 10 contains a total of n/2 contact regions 33, and each of contact regions 33 is shared by odd-number-th sense amplifier portions 10-1, 10-3, . . . , 10-(*n*−1) and even-number-th sense amplifier portions 10-2, 10-4, . . . , 10-*n* adjacent to the odd-number-th sense amplifier portions on the right side thereof in the figure. That is, h-th contact regions 33 (h=1, 2, . . . , n/2) are shared by the (2*h*−1)-th sense amplifier portion 10-(2*h*−1) and the 2*h*-th sense amplifier portion 10-2*h*. Furthermore, h-th contact region 33 is provided so as to be enclosed by ring-shaped electrode portion 21*a* that is formed to straddle sense amplifier portions 10-(2*h*−1) and 10-2*h*. Concretely, because ring-shaped electrode portion 21*a* has a structure having a center opening, contact region 33 is arranged within this center opening.

Next, consideration is given to the size of a k-th sense amplifier portion, k being a positive odd number of less than n, and of a (k+1)-th sense amplifier portion adjacent to this k-th sense amplifier portion. As described above, these sense amplifier portions share contact region 33, and ring-shaped electrode portion 21*a* is formed so as to straddle these sense amplifier portions. Because all of the odd-number-th sense amplifiers have the same shape and all of the even-number sense amplifier portions have the same shape, sense amplifier portions 10-1, 10-2 shown in FIG. 7 are to be considered here.

The length of sense amplifier portions 10-1, 10-2 in the row direction, i.e., the horizontal direction of the figure is denoted by X. Length X is a sum of row-direction length X1 of sense amplifier portion 10-1, row-direction length X2 of sense amplifier portion 10-2, row-direction length X3 of bit line potential supply contact 43. Here, it is supposed that length X1 and length X2 are equal.

Sense amplifier portion 10-1 and sense amplifier portion 10-2 have the same column-direction length and this length is denoted by Y. Length Y is a sum of length Y1, length Y2 and length Y3. Y1 indicates a column-direction length of a region in which first bit line contact 41 is arranged in first bit line-connected active region 31. Length Y2 indicates the width of column-direction gate electrode portion 21*b*. Length Y3 indicates the column-direction length of the area of second bit line-connected active region 32 in which second bit line contact 42 is arranged. This length Y is larger than column-direction length Ya of ring-shaped gate electrode portion 21*a*.

In the above-described semiconductor memory device of this exemplary embodiment, it is possible to reduce the size of sense amplifier circuit 10, for example, in the row direction for the reason described below.

First, in each of sense amplifier portions 10-1 to 10-n, transistor Tr3 is arranged in row-direction gate electrode portion 21b. For this reason, length Y102-1 and length Y102-2 in the semiconductor memory device shown in FIG. 4 become unnecessary. Transistors Tr1, Tr2 are arranged in ring-shaped gate electrode portion 21a, and it is possible to effectively utilize first bit line-connected active region 31 and second bit line-connected active region 32.

Furthermore, because transistors Tr1, Tr2 are arranged in ring-shaped gate electrode portion 21a, it is possible to arrange first bit line contact 41 and second bit line contact 42 respectively in first bit line-connected active region 31 and second bit line-connected active region 32 by just that much. For this reason, length Y101 in FIG. 4 becomes unnecessary. Also, because transistors Tr1, Tr2 are arranged in ring-shaped gate electrode portion 21a, it is possible to arrange bit line potential supply contact 43 in contact region 33 by just that much. It follows that contact region 33 is enclosed by ring-shaped gate electrode portion 21a, and hence length Y104 in FIG. 4 becomes unnecessary.

When it is assumed that X in FIG. 7 is equal to length X100 in FIG. 4, that length Y is almost equal to length Ya, and that length Ya is almost equal to length Y102 and Y103 in FIG. 4, in the semiconductor memory device of this exemplary embodiment, the size of the sense amplifier portions is reduced by length Y101 and Y104 compared to the semiconductor memory device shown in FIG. 4. Thus, according to the semiconductor memory device of this exemplary embodiment, it is possible to reduce the size of the sense amplifier portions.

Incidentally, for the arrangement of the first and second bit lines in a bit line pair, first bit lines 6-1 to 6-n and second bit lines 7-1 to 7-n may be replaced with each other. For first bit line contact 41 and second bit line contact 42, their positions on the same diffusion layer may be changed in consideration of the ease with which interconnects are connected in an upper layer.

While exemplary embodiments of the present invention have been described using specific terms, such description is for illustrative purposes only, and it is to be understood that changes and variations may be made without departing from the spirit or scope of the following claims.

What is claimed is:

1. A sense amplifier comprising:
a first equalizer and a second equalizer connected to a first bit line pair and a second bit line pair, respectively, the first bit line pair and the second bit line pair extending from a memory cell array and being adjacent to each other,
wherein each of the first equalizer and the second equalizer comprises:
a bit line potential supply line to which a bit line potential is supplied;
a transistor group that is arranged between a corresponding bit line pair among the first bit line pair and the second bit line pair, is connected to the bit line potential supply line, and is turned on when a precharge signal is active, thereby to supply the bit line potential to the corresponding bit line pair; and
a gate electrode supplying the precharge signal to a gate of a transistor of the transistor group, and
wherein the gate electrode extends across the first equalizer and the second equalizer and has a ring-like shape at a boundary portion between the first equalizer and the second equalizer.

2. The sense amplifier circuit according to claim 1,
wherein the gate electrode in the first equalizer includes an extending portion extending toward the second equalizer and a branch portion connected to the extending portion,
wherein the transistor group in the first equalizer comprises:
a first transistor connecting one bit line of the first bit line pair to the bit line potential supply line, a gate of the first transistor being connected to the branch portion;
a second transistor connecting the other bit line of the first bit line pair to the bit line potential supply line, a gate of the second transistor being connected to the branch portion; and
a third transistor inserted between the first bit line pair, a gate of the third transistor being connected to the extending portion,
wherein the second equalizer includes a symmetrical shape with respect to the boundary portion, and
wherein the branch portion of the first equalizer and the branch portion of the second equalizer joins to form a ring.

3. The sense amplifier circuit according to claim 2,
wherein the first equalizer further comprises:
a first bit line-connected active region to which the one bit line of the first bit line pair is connected;
a second bit line-connected active region to which the other bit line of the first bit line pair connected; and
a contact region to which the bit line potential supply line is connected,
wherein the first transistor is arranged between the first bit line-connected active region and the contact region;
wherein the second transistor is arranged between the second bit line-connected active region and the contact region;
wherein the third transistor is arranged between the first bit line-connected active region and the second bit line-connected active region; and
wherein the contact region is shared by the first equalizer and the second equalizer and enclosed by a gate electrode portion of the ring-shaped.

4. The sense amplifier circuit according to claim 3, wherein the first equalizer further comprises:
a first bit line contact which is formed on the first bit line-connected active region and to which the one bit line of the first bit pair is connected;
a second bit line contact which is formed on the second bit line-connected active region and to which the other bit line of the first bit line pair is connected; and
a bit line potential supply contact which is provided on the contact region and to which the bit line potential supply line is connected.

5. A semiconductor memory device, comprising:
a memory cell array in which memory cells are arranged in a matrix form;
a plurality of word lines respectively connected to a plurality of rows of the memory cell array;
a plurality of bit line pairs respectively connected to a plurality of columns of the memory cell array;
a word driver driving a word line selected from the plurality of word lines according to a row address during a memory access operation; and
a sense amplifier circuit connected to the plurality of bit line pairs, the send amplifier performing memory access to a memory cell connected to the selected word line and a selected bit line pair which is selected from the plurality of bit line pairs according to the row address, wherein the sense amplifier circuit comprises a plurality of equalizers respectively connected to the plurality of bit line pairs, wherein a first equalizer and a second equalizer are adjacent to each other, included in the plurality of equalizers, and connected to a first bit line pair and a second bit line pair, respectively, each of the first equalizer and the second equalizer comprising:

a bit line potential supply line to which a bit line potential is supplied;

a transistor group that is arranged between a corresponding bit line pair among the first bit line pair and the second bit line pair, is connected to the bit line potential supply line, and is turned on when a precharge signal is active, thereby to supply the bit line potential to the corresponding bit line pair; and     a gate electrode supplying the precharge signal to a gate of a transistor of the transistor group, and wherein the gate electrode extends across the first equalizer and the second equalizer and has a ring-like shape at a boundary portion between the first equalizer and the second equalizer.

6. The semiconductor memory device according to claim 5, wherein the gate electrode in the first equalizer includes an extending portion extending toward the second equalizer and a branch portion connected to the extending portion, wherein the transistor group in the first equalizer comprises:

a first transistor connecting one bit line of the first bit line pair to the bit line potential supply line, a gate of the first transistor being connected to the branch portion;

a second transistor connecting the other bit line of the first bit line pair to the bit line potential supply line, a gate of the second transistor being connected to the branch portion; and     a third transistor inserted between the first bit line pair, a gate of the third transistor being connected to the extending portion, wherein the second equalizer includes a symmetrical shape with respect to the boundary portion, and wherein the branch portion of the first equalizer and the branch portion of the second equalizer joins to form a ring.

7. The semiconductor memory device according to claim 6, wherein the first equalizer further comprises:

a first bit line-connected active region to which the one bit line of the first bit line pair is connected;

a second bit line-connected active region to which the other bit line of the first bit line pair connected; and     a contact region to which the bit line potential supply line is connected, wherein the first transistor is arranged between the first bit line-connected active region and the contact region;

wherein the second transistor is arranged between the second bit line-connected active region and the contact region;

wherein the third transistor is arranged between the first bit line-connected active region and the second bit line-connected active region; and wherein the contact region is shared by the first equalizer and the second equalizer and enclosed by a gate electrode portion of the ring-shaped.

8. The semiconductor memory device according to claim 7, wherein the first equalizer further comprises:

a first bit line contact which is formed on the first bit line-connected active region and to which the one bit line of the first bit pair is connected;

a second bit line contact which is formed on the second bit line-connected active region and to which the other bit line of the first bit line pair is connected; and     a bit line potential supply contact which is provided on the contact region and to which the bit line potential supply line is connected.

* * * * *